United States Patent
Lee et al.

(10) Patent No.: US 7,563,686 B2
(45) Date of Patent: Jul. 21, 2009

(54) METHOD FOR FORMING A MEMORY DEVICE WITH A RECESSED GATE

(75) Inventors: Pei-Ing Lee, Changhua County (TW); Chung-Yuan Lee, Taoyuan (TW); Chien-Li Cheng, Hsinchu (TW)

(73) Assignee: Nanya Technology Corporation, Taoyuan (TW)

( * ) Notice: Subject to any disclaimer, the term of this patent is extended or adjusted under 35 U.S.C. 154(b) by 349 days.

(21) Appl. No.: 11/140,889

(22) Filed: May 31, 2005

(65) Prior Publication Data

US 2006/0270176 A1 Nov. 30, 2006

(51) Int. Cl.
*H01L 21/20* (2006.01)

(52) U.S. Cl. .............. 438/386; 257/E21.375; 257/E21.396; 257/E21.652; 438/259; 438/270

(58) Field of Classification Search .......... 438/259, 438/270, 386; 257/E21.375, E21.396, E21.652
See application file for complete search history.

(56) References Cited

U.S. PATENT DOCUMENTS

| | | | | |
|---|---|---|---|---|
| 6,037,194 A | * | 3/2000 | Bronner et al. | 438/147 |
| 6,190,971 B1 | * | 2/2001 | Gruening et al. | 438/270 |
| 6,656,807 B2 | * | 12/2003 | Bronner et al. | 438/296 |
| 7,132,333 B2 | * | 11/2006 | Schloesser et al. | 438/272 |
| 7,274,060 B2 | * | 9/2007 | Popp et al. | 257/302 |
| 7,316,952 B2 | * | 1/2008 | Lee | 438/243 |
| 2005/0245024 A1 | * | 11/2005 | von Schwerin | 438/243 |
| 2006/0006446 A1 | * | 1/2006 | Schwerin | 257/308 |

* cited by examiner

*Primary Examiner*—Eugene Lee
*Assistant Examiner*—Peniel M Gumedzoe
(74) *Attorney, Agent, or Firm*—Quintero Law Office

(57) ABSTRACT

A method for forming a memory device with a recessed gate is disclosed. A substrate with a pad layer thereon is provided. The pad layer and the substrate are patterned to form at least two trenches. A deep trench capacitor device is formed in each trench. The pad layer is recessed until upper portions of the deep trench capacitor devices are revealed. Spacers are formed on sidewalls of the upper portions of the deep trench capacitor devices. The pad layer and the substrate are etched using the spacers and the deep trench capacitor devices as a mask to form a recess, and a recessed gate is formed in the recess.

5 Claims, 10 Drawing Sheets

US 7,563,686 B2

METHOD FOR FORMING A MEMORY DEVICE WITH A RECESSED GATE

BACKGROUND

The present invention relates in general to a method of fabricating a memory device, and more particularly, to a method of fabricating a memory device with a recessed gate.

In the rapidly evolving integrated circuit industry there is a development tendency toward high performance, miniaturization, and high operating speed. Additionally dynamic random access memory (DRAM) fabrication methods have developed rapidly.

Typically, current dynamic random access memory DRAM cells include a transistor and a capacitor. Since the capacity of current DRAM has reached 256 MB and up to 512 MB, the size of memory cells and transistors has narrowed to meet demands for high integration, higher memory capacity and higher operating speeds. In conventional planar transistor technology, however, more useable surface area on a chip is required, and it is difficult to meet the previously mentioned demands. Accordingly, recessed gate and channel technology has been applied to DRAM fabrication with the goal of reducing the area occupied by the transistor and the capacitor on the semiconductor substrate. The conventional planar transistor technology requires a large amount of surface area on the chip, and cannot accomplish the demand for high integration. Conversely, the disadvantages of the conventional semiconductor memory cell can be improved by applying recessed vertical gate transistor RVERT technology to DRAM fabrication And the RVERT technology is positioned to become a major semiconductor memory cell fabrication method.

FIG. 1 is a top view of conventional vertical gate transistor. Referring to FIG. 1, a distance between a recessed gate and a deep trench capacitor 104 is required to be controlled precisely due to requirement for controlling out diffusion distance D. The overlay control of forming recessed gate in conventional lithography process, however, is very tight when process generation is 60 nm or further.

SUMMARY

These and other problems are generally solved or circumvented, and technical advantages are generally achieved, by preferred illustrative embodiments of the present invention, which provide a method for forming a semiconductor device.

An embodiment of the invention provides a method for forming a semiconductor device. A substrate with a pad layer thereon is provided. The pad layer and the substrate are patterned to form at least two trenches. A deep trench capacitor device is formed in each trench. The pad layer is recessed until upper portions of the deep trench capacitor devices are revealed. Spacers are formed on sidewalls of the upper portions of the deep trench capacitor devices. The pad layer and the substrate are etched using the spacers and the deep trench capacitor devices as a mask to form a recess, and a recessed gate is formed in the recess.

An embodiment of the invention provides a method for forming a semiconductor device. A substrate with a pad layer thereon is provided. The pad layer and the substrate are patterned to form at least two trenches. A deep trench capacitor device is formed in each trench. A protrusion is formed on each deep trench capacitor device, wherein a top surface level of each protrusion is higher than that of the pad layer. Spacers are formed on sidewalls of the protrusions, and the pad layer and the substrate are etched using the spacers and the protrusions as a mask to form a recess. A recessed gate is formed in the recess.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
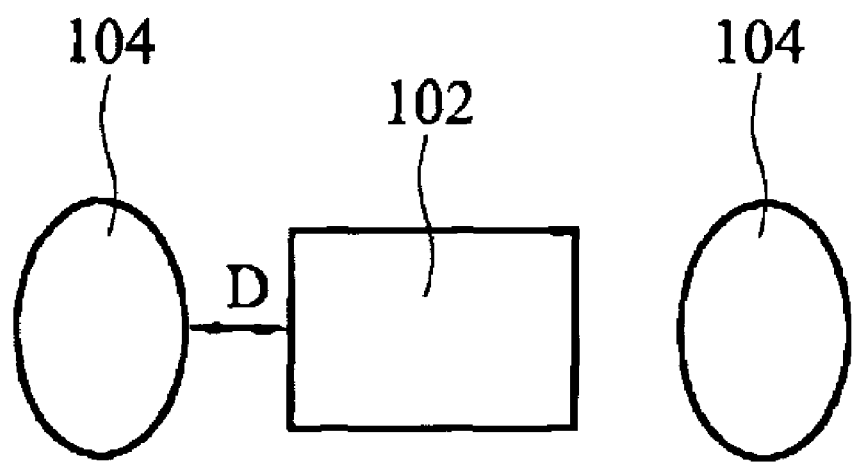
FIG. 1 is a top view of conventional vertical gate transistor.

Embodiments of the invention, which provides a method for forming a semiconductor device, will be described in greater detail by referring to the drawings that accompany the invention. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

Figure 2A:
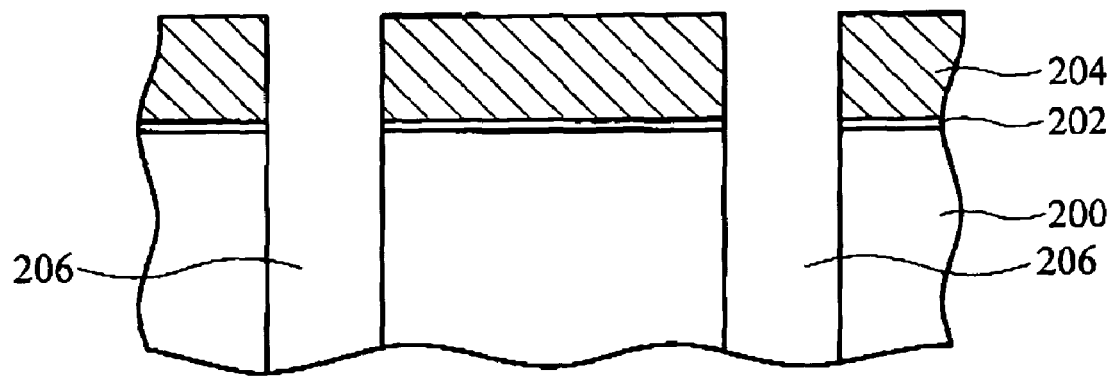
FIG. 2A-FIG. 2J illustrate process steps for forming a memory with a recessed vertical transistor of an embodiment of the invention.

FIG. 2A-FIG. 2J illustrate process steps for forming a memory with a recessed vertical transistor of an embodiment of the invention. Referring to FIG. 2A, a substrate 200 is provided, and a first pad layer 202 and a second pad layer 204 are disposed on the substrate 200. The substrate 200 may comprise silicon, gallium arsenide, gallium nitride, strained silicon, silicon germanium, silicon carbide, diamond, an epitaxy layer, and/or other materials. The first pad layer 202 may comprise silicon oxide, the second pad layer 204 may comprise silicon nitride, and both patterned by conventional lithography and then etched to form at least two openings.

Figure 2B:
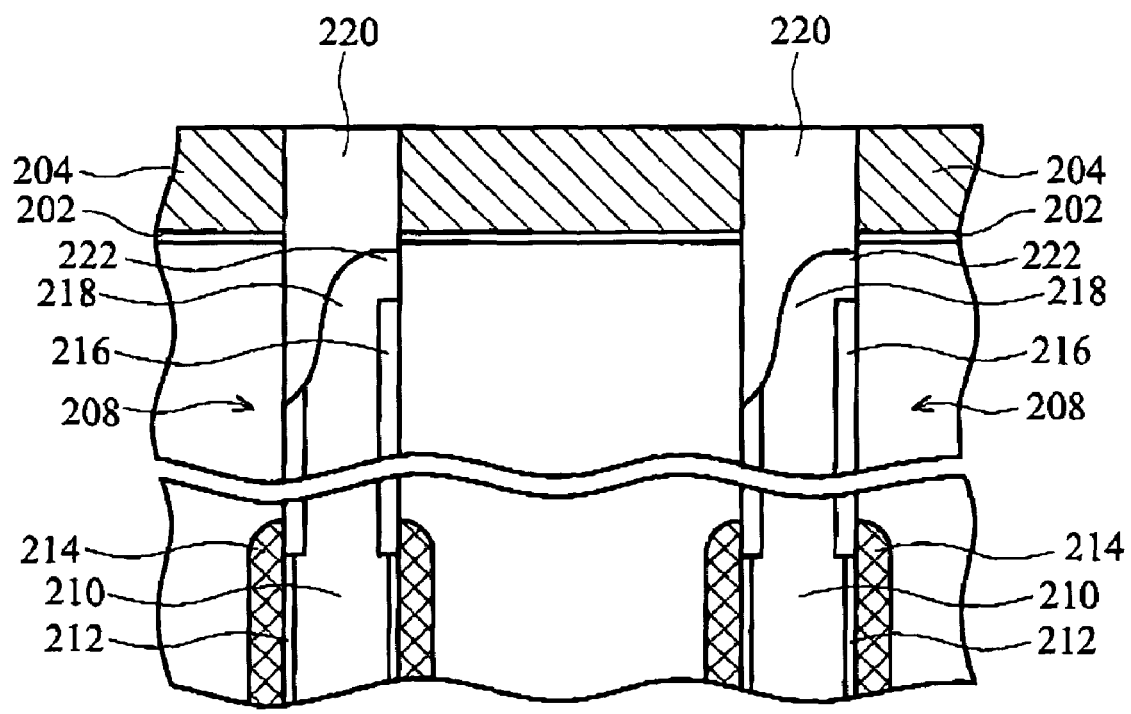

Next, the substrate 200 is etched to form at least two trenches 206 using the patterned first pad layer 202 and second pad layer 204 as a hard mask. As shown in FIG. 2B, deep trench capacitors 208 are formed in the trenches. Lower portion of a deep trench capacitor 208 comprises a top electrode 210, such as polysilicon, a capacitor dielectric layer 212, such as ONO, and a bottom electrode 214. Upper portion of a deep trench capacitor 208 comprises a collar dielectric layer 216, a conductive layer 218 electrically connects the top electrode 212, and a single side insulating layer 220 disposed at the top, isolating one side and exposing the other side to form a buried strap 222. In an embodiment of the invention, top surface of the single side insulating layer 220 is at substantially the same level as the second pad layer 204.

Figure 2C:
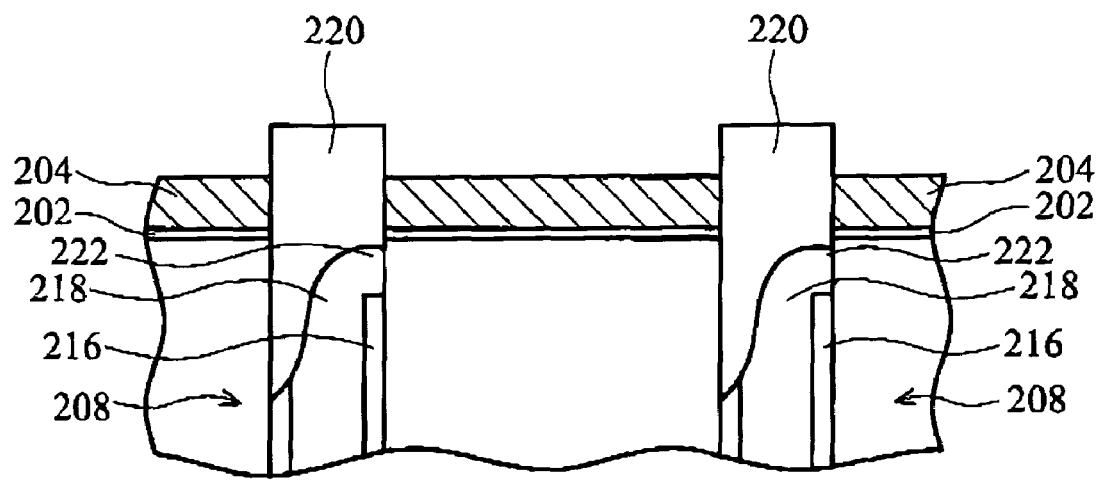

Next, referring to FIG. 2C, the second pad layer 204 is recessed using selective etching to reveal a portion of the deep trench capacitors 208. Preferably, after the described recessing step, a portion of the deep trench capacitors 208 protrude above the substrate 200 surface level. For example, when the second pad layer 204 is silicon nitride and the single side insulating layer 220 of the deep trench capacitor 208 is silicon oxide, recessing of the second pad layer 204 can be accomplished by immersion in phosphoric acid.

Figure 2D:
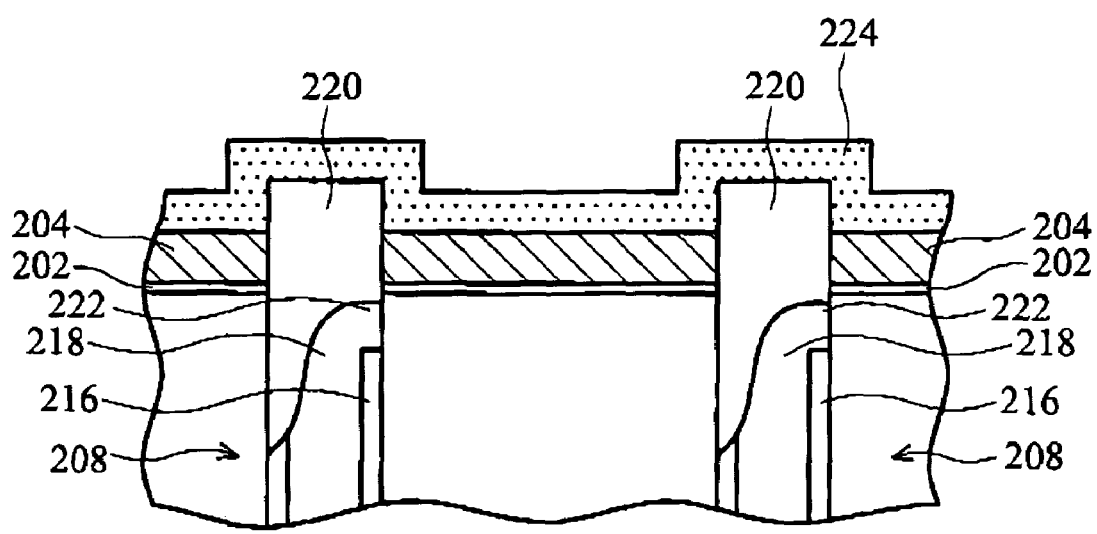

Referring to FIG. 2D, a spacer layer 224 is formed on the second pad layer 204 and the single side insulating layer 220 by deposition. The spacer layer 224 can be silicon nitride, silicon oxide, silicon oxynitride, a combination thereof, a stack layer thereof, polyimide, SOG, low K dielectric layer, such as FSG, Black Diamond, SILK™, FLARE™, LKD, Xerogel, or Aerogel, or other material. Preferably, the spacer layer 224 comprises silicon nitride.

Figure 2E:
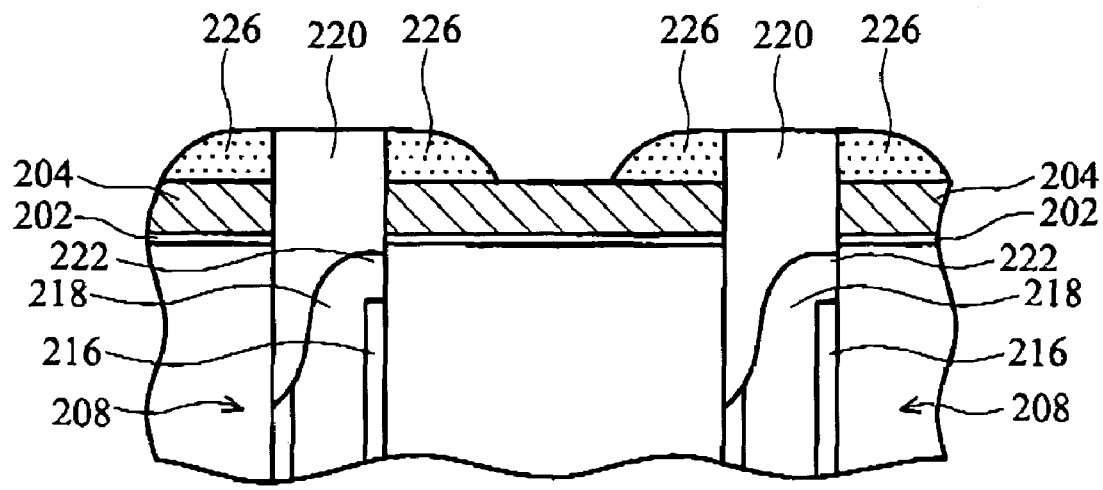

Next, as shown in FIG. 2E, the spacer layer is etched to form spacers 226 on sidewalls of the revealed portions of the deep trench capacitors 208. In the preferred embodiment of the invention, when the spacers 226 comprise silicon nitride, the etching step described can use $CHF_3$, a combination of $CF_4$ and $O2$, or a combination of $C_2F_6$ as main etchant, and can also be further enhanced with plasma. When the spacers 226 are silicon oxide, the etching can use $CHF_3$, combination of $CF_4$ and $O_2$, combination of $CF_4$, or a $C_2F_6$ or $C_3F_8$ as main etchant, and can also be further enhanced with plasma. The width and height of the spacers 226 can affect channel length, source width and drain width, and can be well controlled by fine tuning process parameters, such as etching pressure, temperature, power, bias, gas flow.

Figure 2F:
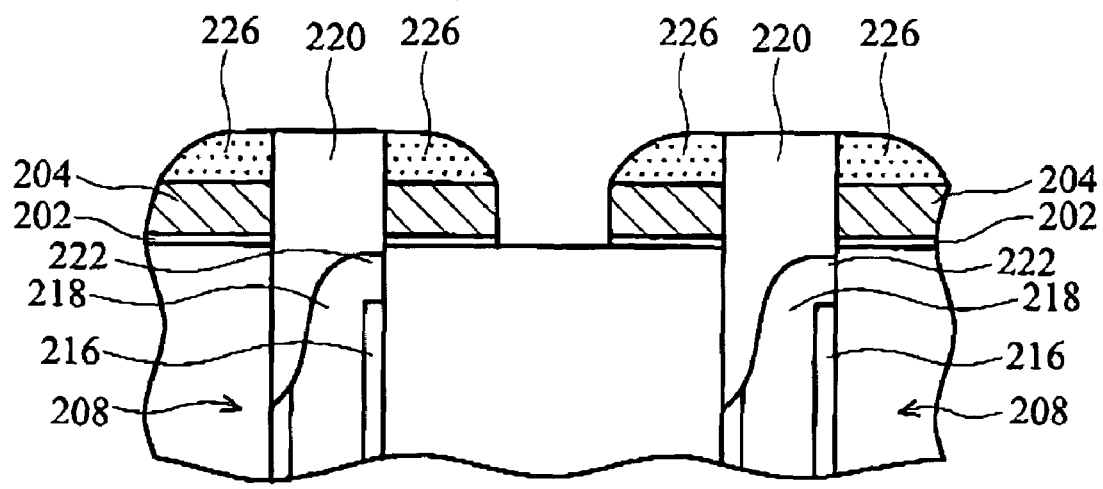
Figure 2G:
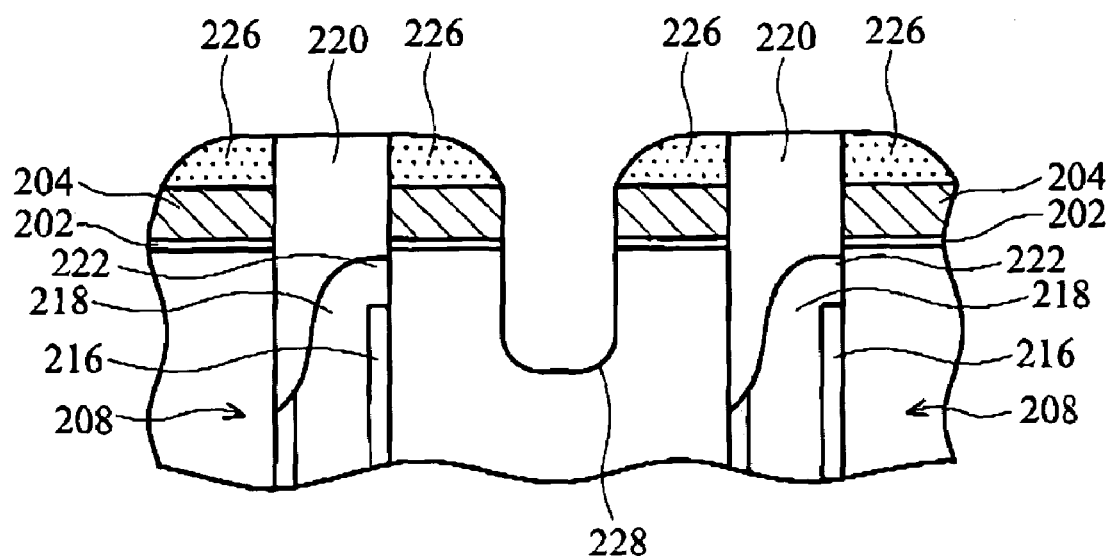

Referring to FIG. 2E, the second pad layer 204 and the first pad layer 202 are etched respectively using the spacers 226 and single side isolation 220 of the deep trench capacitors 208 as an etching mask. Referring to FIG. 2F, the substrate 200 is etched by anisotropic etching, such as reactive ion etching, to form a recess 228 between the deep trench capacitors 208 using the spacers 226, the single side isolation 220 of the deep trench capacitors 208 and the etched first and second pad layers 202 and 204 as an etching mask.

Figure 2H:
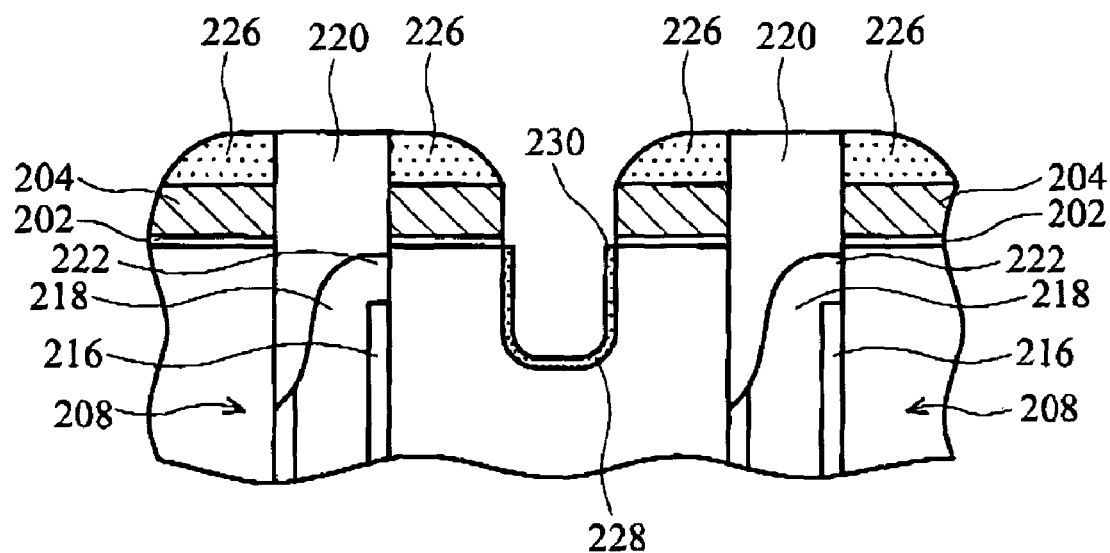

Next, referring to FIG. 2H, a gate dielectric layer 230, preferably comprising silicon oxide, is formed on the bottom and sidewall of the recess 228. The gate dielectric layer 230 can be formed using a thermal process or a deposition process. The thermal process can be rapid thermal oxidation, furnace oxidation or in situ steam generation ISSG. The deposition process can be low pressure chemical vapor deposition LPCVD, high temperature oxide (HTO) deposition and the like.

Figure 2I:
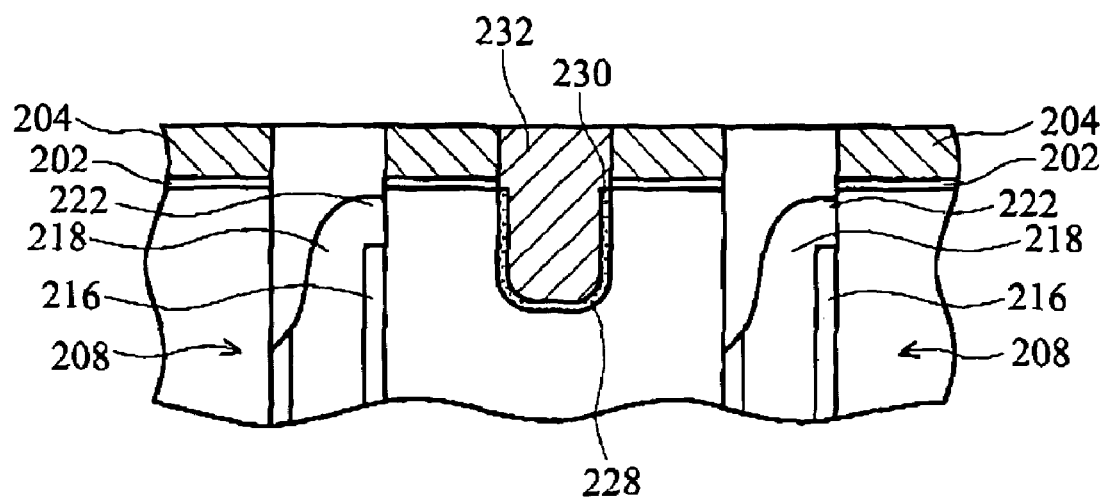

Referring to FIG. 2I, a conductive material, such as polysilicon, tungsten or tungsten silicide is filled into the recess to form a recessed gate 232. Next, the top portion of the deep trench capacitors 208, the spacers, and a portion of the recessed gate 232 is planarized by chemical mechanical polishing CMP to recess the recessed gate 232. The invention, however, is not limited, the recess step can also be accomplished by etching back.

Figure 2J:
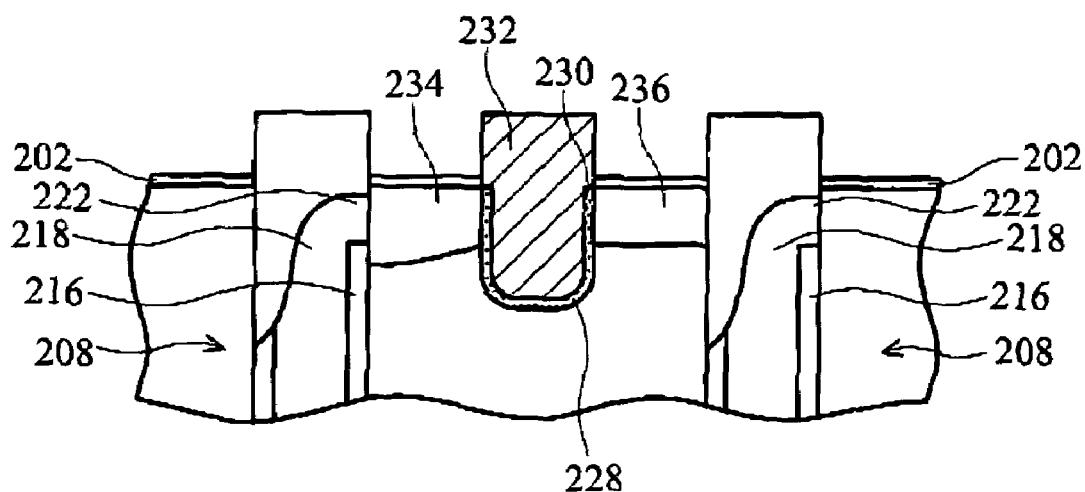

Referring to FIG. 2J, the second pad layer is removed by wet etching, such as immersion in phosphoric acid. Next, the substrate 200 is ion implanted to form a source region 234 and a drain region 236 on opposite sides of the recessed gate 232, wherein the source region 234 electrically connects the buried strap region 222 of the adjacent deep trench capacitor 208.

According to the embodiment described, one photolithography step may be omitted when forming the recessed gate, thus reducing cost. Further, due to self-alignment of the recessed gate with spacers instead of photolithography, a length between RVERT and deep trench capacitors may be precisely controlled, and out diffusion distance therebetween may be controlled more easily.

Figure 3A:
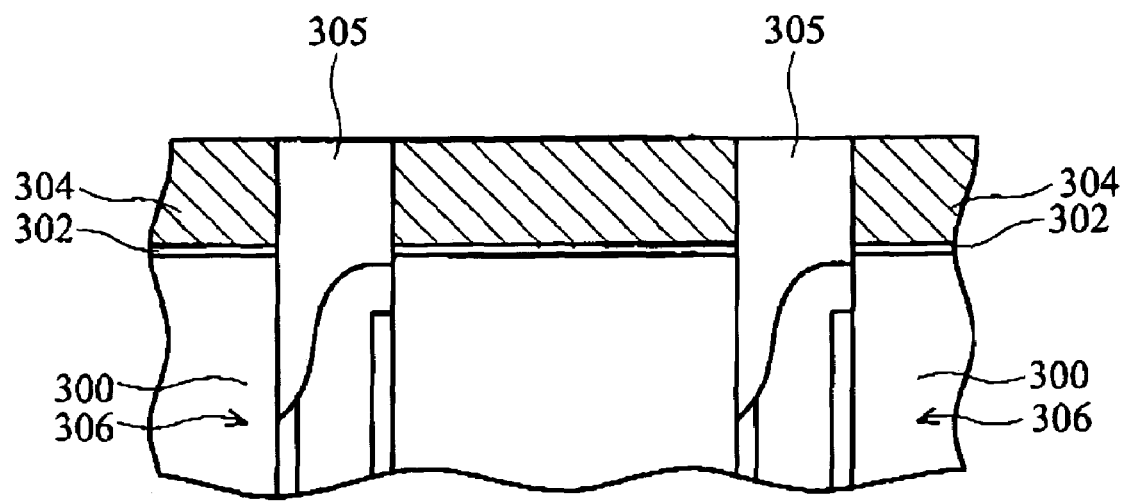
FIG. 3A-FIG. 3G illustrate process steps for forming a memory with a recessed vertical transistor of another embodiment of the invention.

FIG. 3A-FIG. 3G illustrate process steps for forming a memory with a recessed vertical transistor of another embodiment of the invention. Referring to FIG. 3A, a substrate 300 is provided, and a first pad layer 302 and a second pad layer 304 are disposed on the substrate 300. The substrate 300 may comprise silicon, gallium arsenide, gallium nitride, strained silicon, silicon germanium, silicon carbide, diamond, an epitaxy layer, and/or other materials. The first pad layer may comprise silicon oxide and the second pad layer may comprise silicon nitride. The first pad layer 302 and the second pad layer 304 are patterned by conventional lithography and etching to form at least two openings. The substrate 300 is etched to form at least two trenches using the patterned first and second pad layers 302 and 304 as a hard mask. Deep trench capacitors 306 are formed in the trenches. Structures of the deep trench capacitors 306 are similar with the previously described embodiment, and as such are not mentioned in detail for simplifying. In this embodiment of the invention, the top of single side insulating layers 305 of the deep trench capacitors are substantially the same level as the second pad layer.

Figure 3B:
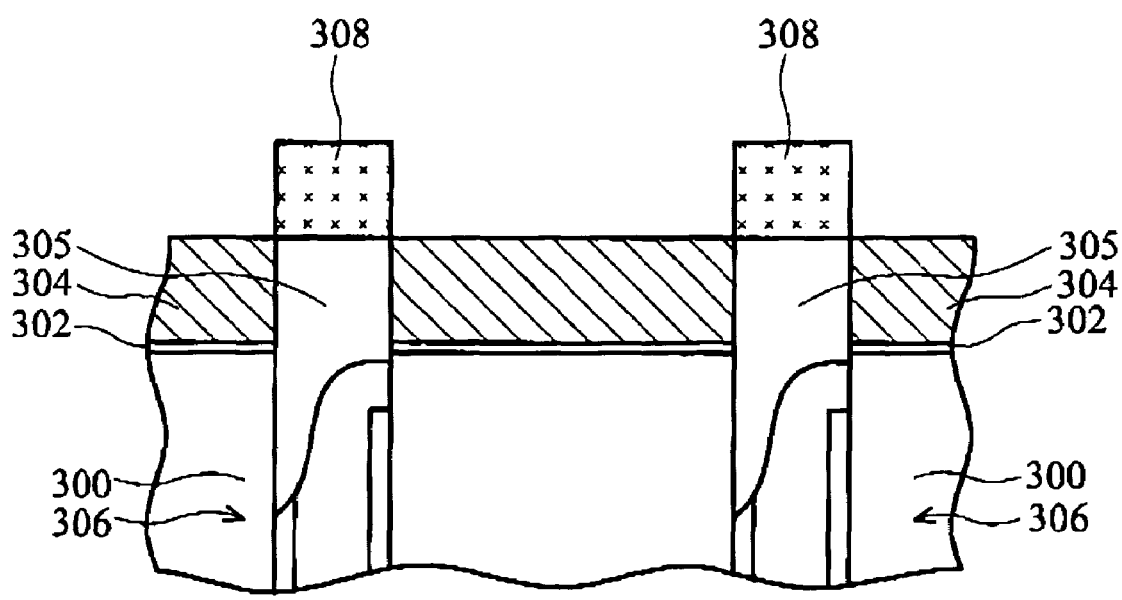

Next, referring to FIG. 3B, protrusions 308 are formed on the deep trench capacitors 306, and specifically the position of protrusions 308 are aligned to the deep trench capacitors 306. Preferably, the protrusions 308 are formed by a self-aligned method, such as selective oxide deposition by SAVCD. In SAVCD process, the deposition rate of depositing oxide material on an oxide layer is 5 times of depositing oxide material on a nitride layer. The invention, however, is not limited thereto, the protrusions can also be formed by conventional deposition, pattern by lithography and then etch back.

Figure 3C:
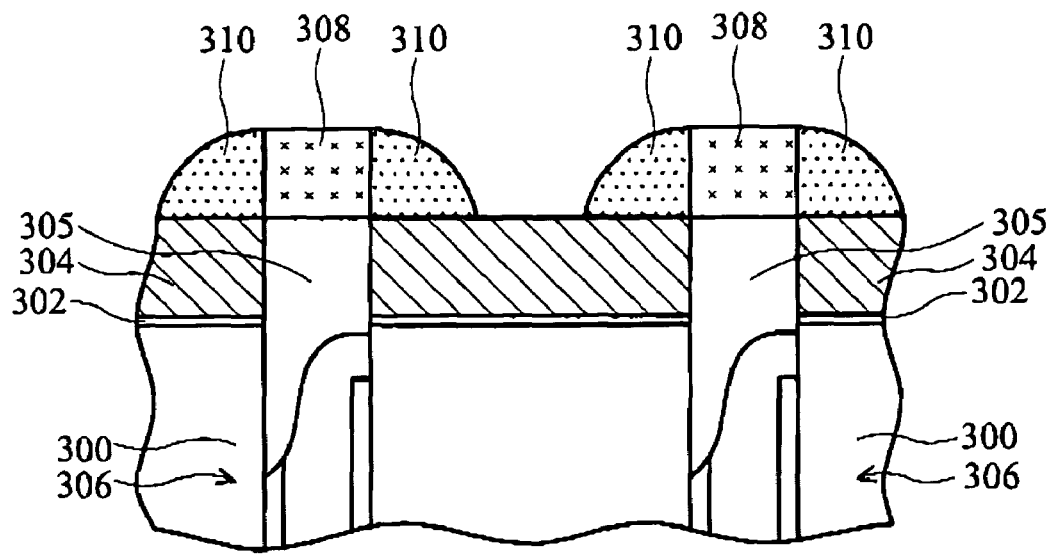

Referring to FIG. 3C, a spacer layer (not shown) is formed on the second pad layer 304 and the protrusions 308 by deposition. The spacer layer can be silicon nitride, silicon oxide, silicon oxynitride, combination thereof, stack layer thereof, polyimide, SOG, low K dielectric layer, such as FSG, Black Diamond, SILK™, FLARE™, LKD, Xerogel, or Aerogel, or other material. Preferably, the spacer layer comprises silicon nitride. Next, the spacer layer is etched to form spacers 310 on sidewalls of the protrusions 308 of the deep trench capacitors. In the preferred embodiment of the invention, the etching is anisotropic etching, which can use $CHF_3$, a combination of $CF_4$ and $O_2$, a combination of $C_2F_6$ as the main etchant when the spacer layer is silicon nitride, and can also be further enhanced with plasma. When the spacer layer is silicon oxide, the anisotropic etching can use $CHF_3$, combination of $CF_4$ and $O_2$, a combination of $CF_4$, $C_2F_6$ or $C_3F_8$ as the main etchant, and can also be further enhanced with plasma. The width and height of the spacers 310 can affect channel length, source width and drain width, and can be controlled by fine tuning process parameters, such as etching pressure, temperature, power, bias, gas flow.

Figure 3D:
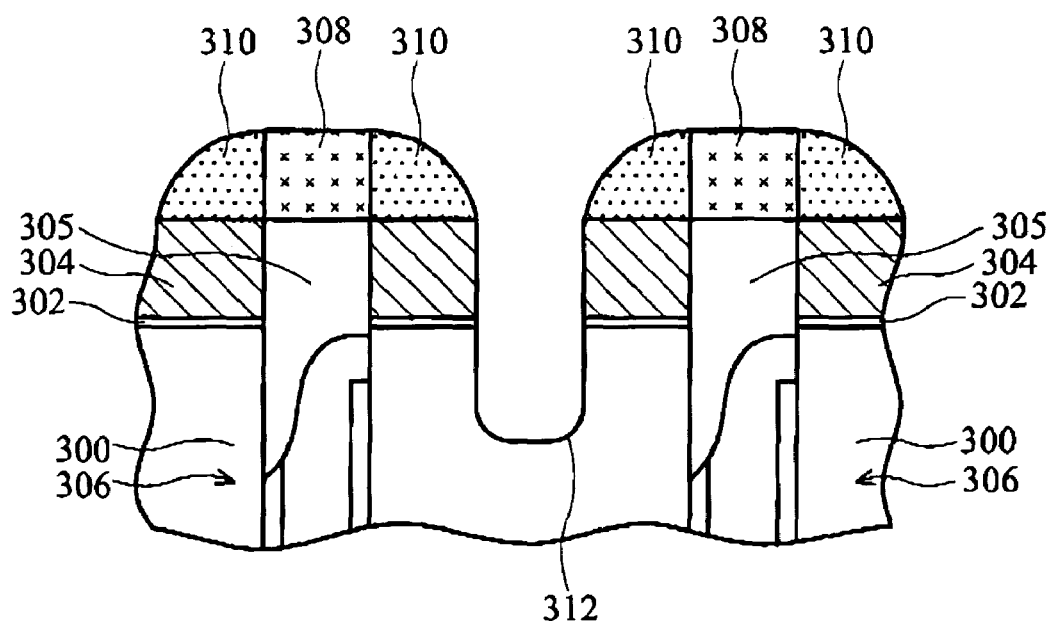

Referring to FIG. 3D, the second pad layer 304 and the first pad layer 302 are etched in sequence using the spacers 310 and protrusions 308 as an etching mask. Next, anisotropic etching, such reactive ion etching, proceeds to etch the substrate 300 to form a recess 312 between the deep trench capacitors 306 using the spacers 310, the protrusions 308 and the etched first and pad layers 302 and 304 as an etching hard mask.

Figure 3E:
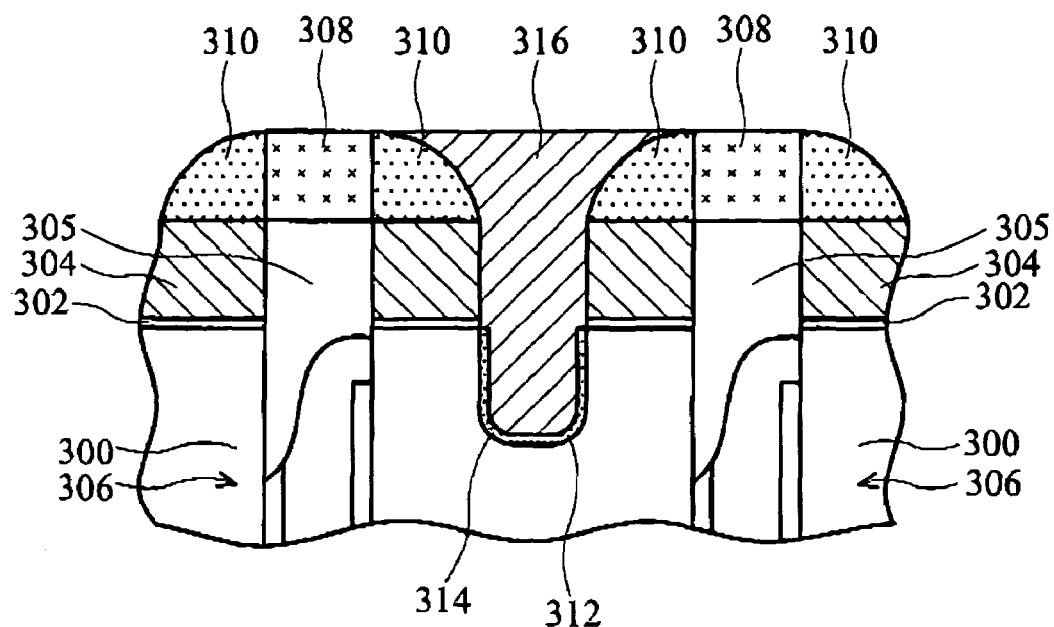
Figure 3F:
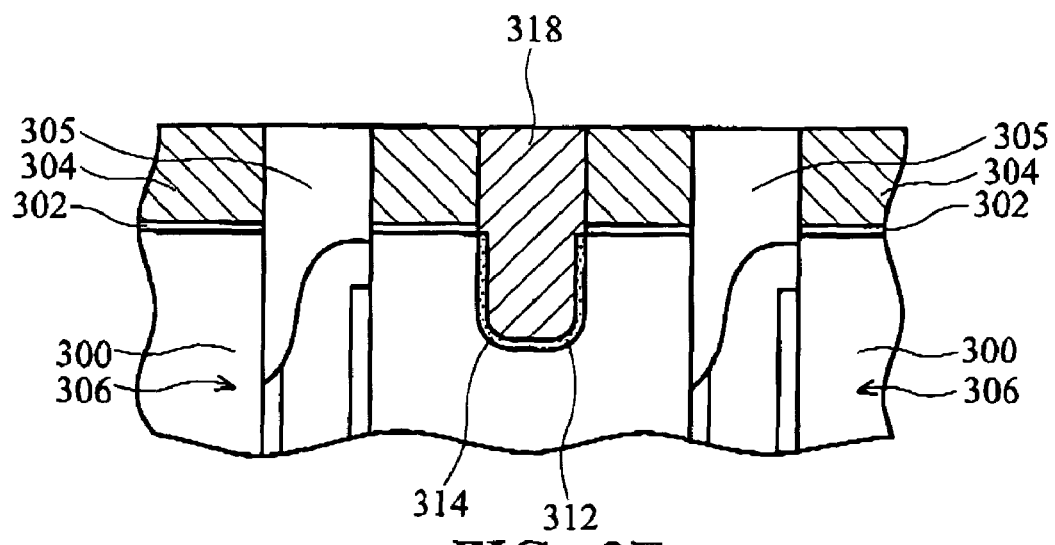

Next, referring to FIG. 3E, a gate dielectric layer 314 is formed on the bottom and sidewall of the recess 312. Preferably, the gate dielectric layer 314 is silicon oxide, which can be formed using a thermal process or a deposition process. The thermal process can be rapid thermal oxidation, furnace oxidation or in situ steam generation ISSG. The deposition process can be low pressure chemical vapor deposition LPCVD, high temperature oxide (HTO) deposition and the like.

Next, a conductive material 316, such as polysilicon, tungsten, tungsten silicide or other conductive material is filled into the recess. Thereafter, as shown to FIG. 3F, the spacers 310, the protrusions 308 and the conductive material are planarized by chemical mechanical polishing CMP to recess the conductive material to form a recessed gate 318. The invention, however, is not limited to this, the recess step can also be accomplished by etching back.

Figure 3G:
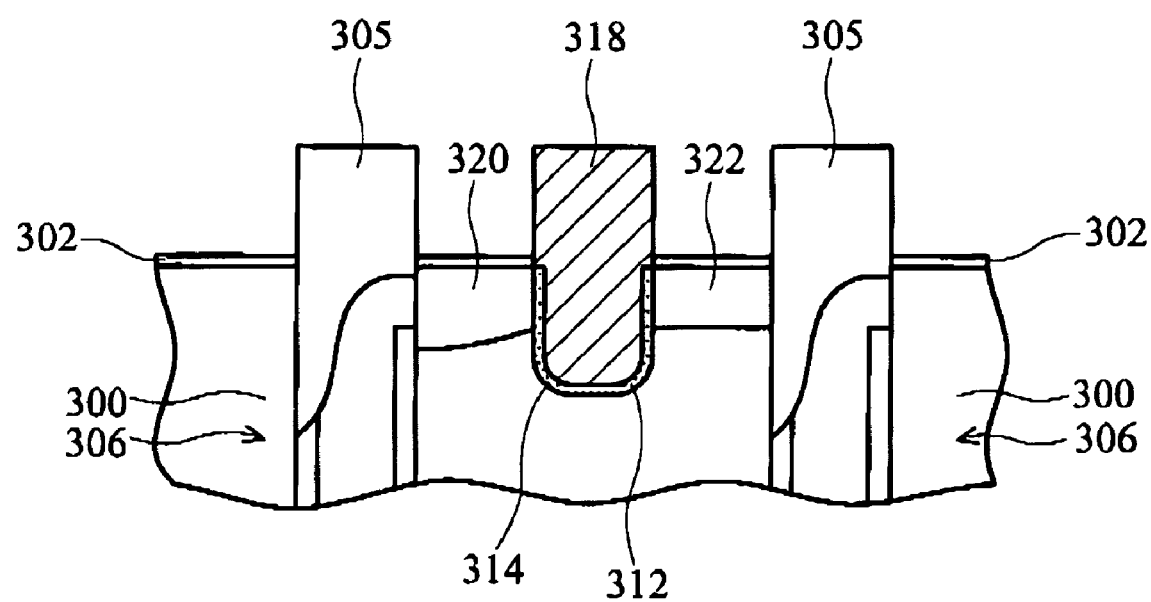

Referring to FIG. 3G, the second pad layer is removed by etching, such as immersing phosphoric acid. Next, the substrate 300 is ion implanted to form a source region 320 and a drain region 322 adjacent to the recessed gate 318, wherein the source region 320 electrically connects the conductive layers of the deep trench capacitor at the buried strap region.

According to the embodiment of the invention described, one photolithography step may be omitted when forming the recessed gate, thus reducing cost. Further, due to self-alignment of the recessed gate with spacers instead of photolithography, a length between RVERT and deep trench capacitors may be precisely controlled, and out diffusion distance therebetween may be controlled more easily.

While the invention has been described by way of example and in terms of the preferred embodiment, it is to be understood that the invention is not limited thereto. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. A method for forming a semiconductor device having a recessed gate therein, comprising:
   forming trenches in a substrate;
   forming a trench capacitor in each of the trenches, wherein an upper portion of each of the trench capacitors extends away from a top face of the substrate and is aligned to each of the trenches respectively;
   forming a spacer on two opposite sidewalls of the upper portion of each of the trench capacitors such that the spacer is entirely above the top face of the substrate;
   defining in the substrate a recess between two adjacent trench capacitors using adjacent trench capacitors and adjacent spacers as a mask; and
   filling the recess with a conductive material so as to form the recessed gate in the recess.

2. The method for forming a semiconductor device as claimed in claim 1 further comprising a pad layer conformally formed on the substrate and surrounding the upper portion of each of the trench capacitors.

3. The method for forming a semiconductor device as claimed in claim 2, wherein the recess defining step comprising the steps of:
   recessing the pad layer to expose the upper portion; and
   forming the spacer on the sidewalls of the upper portion and on the pad layer.

4. A method for forming a semiconductor device, comprising:
   providing a substrate with a pad layer thereon;
   forming trenches in the substrate and the pad layer;
   forming a trench capacitor in each of the trenches, wherein a top surface of each of the trench capacitors is above a top surface of the pad layer and is aligned to a bottom surface of each of the trenches respectively;
   forming a spacer on a sidewall of each of the trench capacitors to allow the spacer to be on top of the pad layer; and
   forming a recessed gate between two adjacent the trench capacitors using adjacent trench capacitors, adjacent spacers, and the pad layer as a mask.

5. A method for forming a semiconductor device, comprising:
   providing a substrate with a pad layer thereon;
   forming trench capacitors in the substrate, wherein a top surface of each of the trench capacitors is above a top surface of the substrate;
   forming a spacer on a sidewall of each of the trench capacitors such that the spacer is located above the substrate;
   forming a single recessed gate between two adjacent trench capacitors using adjacent trench capacitors and adjacent spacers as a mask.

* * * * *